(12) United States Patent
Koishikawa

(10) Patent No.: US 6,703,662 B1
(45) Date of Patent: Mar. 9, 2004

(54) SEMICONDUCTOR DEVICE AND MANUFACTURING METHOD THEREOF

(75) Inventor: Yukimasa Koishikawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/723,387

(22) Filed: Nov. 28, 2000

(30) Foreign Application Priority Data

Dec. 21, 1999 (JP) ............................................. 11-362925

(51) Int. Cl.[7] .............................................. H01L 29/788
(52) U.S. Cl. ........................................ 257/316; 257/401
(58) Field of Search ................................. 257/316, 900, 257/401

(56) References Cited

U.S. PATENT DOCUMENTS

| | | | | |
|---|---|---|---|---|
| 4,051,464 A | * | 9/1977 | Huang | .......................... 340/173 |
| 4,462,090 A | * | 7/1984 | Iizuka | .......................... 257/316 |
| 5,656,840 A | * | 8/1997 | Yang | .......................... 257/316 |
| 6,291,853 B1 | * | 9/2001 | Io | .......................... 257/314 |

FOREIGN PATENT DOCUMENTS

| | | |
|---|---|---|
| JP | 02-062074 | 3/1990 |
| JP | 07-326684 | 12/1995 |
| JP | 10-022404 | 1/1998 |
| JP | 10-056091 | 2/1998 |
| JP | 11-297866 | 10/1999 |

* cited by examiner

*Primary Examiner*—Mark V. Prenty
(74) *Attorney, Agent, or Firm*—Choate, Hall & Stewart

(57) ABSTRACT

A semiconductor device comprises a memory cell transistor and a select transistor. An N-type first diffusion layer area is formed below side walls formed on the sides of the memory cell transistor. An N-type second diffusion layer area is formed in an area different from the diffusion layer area. A gate of the select transistor is provided above a channel area between the first diffusion layer area and the second diffusion layer area.

3 Claims, 4 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly to a nonvolatile semiconductor memory device including a floating gate and a control gate, and to a manufacturing method thereof.

2. Description of the Related Art

FIG. 1 is a section view showing a nonvolatile semiconductor memory device of a prior art including a floating gate and a control gate.

In FIG. 1, the nonvolatile memory device of the prior art including floating gate 21 and control gate 22 is manufactured by forming element isolation area 24 in silicon substrate 23, forming tunnel gate oxide film 25, floating gate 21, ONO film 26, and control gate 22 on silicon substrate 23 in this order, and forming gate sections of memory cell transistor 27 and select transistor 28 in the same structure through a lithography technique. Then, ion implantation is performed in self-alignment with the gate sections of memory cell transistor 27 and select transistor 28 used as masks to form N-type diffusion layers 29, and contact 30 and wiring 31 are formed, thereby forming a desired nonvolatile memory device.

The aforementioned prior art nonvolatile memory device, however, has disadvantages as follows. (1) A memory cell has a large size since the lithography limit determines the interval between a memory cell transistor and a select transistor.

(2) The diffusion layer area between a memory cell transistor and a select transistor exhibits a high resistance due to its large area to reduce a current flowing between a drain and a source when data is read from a memory, making it difficult to perform detection for determination of "0" or "1" of a cell.

SUMMARY OF THE INVENTION

It is an object of the present invention to provide a new semiconductor device capable of improving the prior art with the aforementioned disadvantages, and specifically, reducing the size of a memory cell area and accurately detecting stored data.

To achieve the aforementioned object, the present invention employs a technical configuration as described below.

Specifically, a semiconductor device of a first aspect according to the present invention comprises:
- a memory cell transistor including a floating gate and a control gate;
- a select transistor;
- side walls formed on the sides of the gates of the memory cell transistor; and
- a diffusion layer area formed below the side wall and forming part of the memory cell transistor and the select transistor.

A semiconductor device of a second aspect of the present invention comprises:
- a memory cell transistor including a floating gate and a control gate;
- a select transistor;
- side walls formed on the sides of the gates of the memory cell transistor;
- a first diffusion layer area of a first conductive type formed below the side wall;
- a second diffusion layer area of the first conductive type formed in an area different from the first diffusion layer area of the first conductive type; and
- a gate of the select transistor provided above a channel area between the first diffusion layer area of the first conductive type and the second diffusion layer area of the first conductive type.

A method of manufacturing a semiconductor device comprising a memory cell transistor including a floating gate and a control gate and a select transistor of a first aspect of the present invention comprises at least:
- a first step of forming the floating gate and the control gate of the memory cell transistor;
- a second step of forming a first diffusion layer area of a first conductive type using the gates of the memory cell transistor formed at the first step;
- a third step of forming side walls on the sides of the floating gate and the control gate of the memory cell transistor;
- a fourth step of forming a diffusion layer area of a second conductive type using the gates of the memory cell transistor and the side walls;
- a fifth step of forming a gate oxide film for the select transistor and forming a gate of the select transistor on the gate oxide film; and
- a sixth step of forming a second diffusion layer area of the first conductive type using the gates of the memory cell transistor, the side wall, and the gate of the select transistor.

In a method of manufacturing a semiconductor device of a second aspect of the present invention, the gate of the select transistor is formed to overlap the gate of the memory cell transistor.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENT

An embodiment of a semiconductor device and an embodiment of a manufacturing method thereof according to the present invention are hereinafter described in detail with reference to the drawings.

Embodiment of Semiconductor Device

Figure 1:
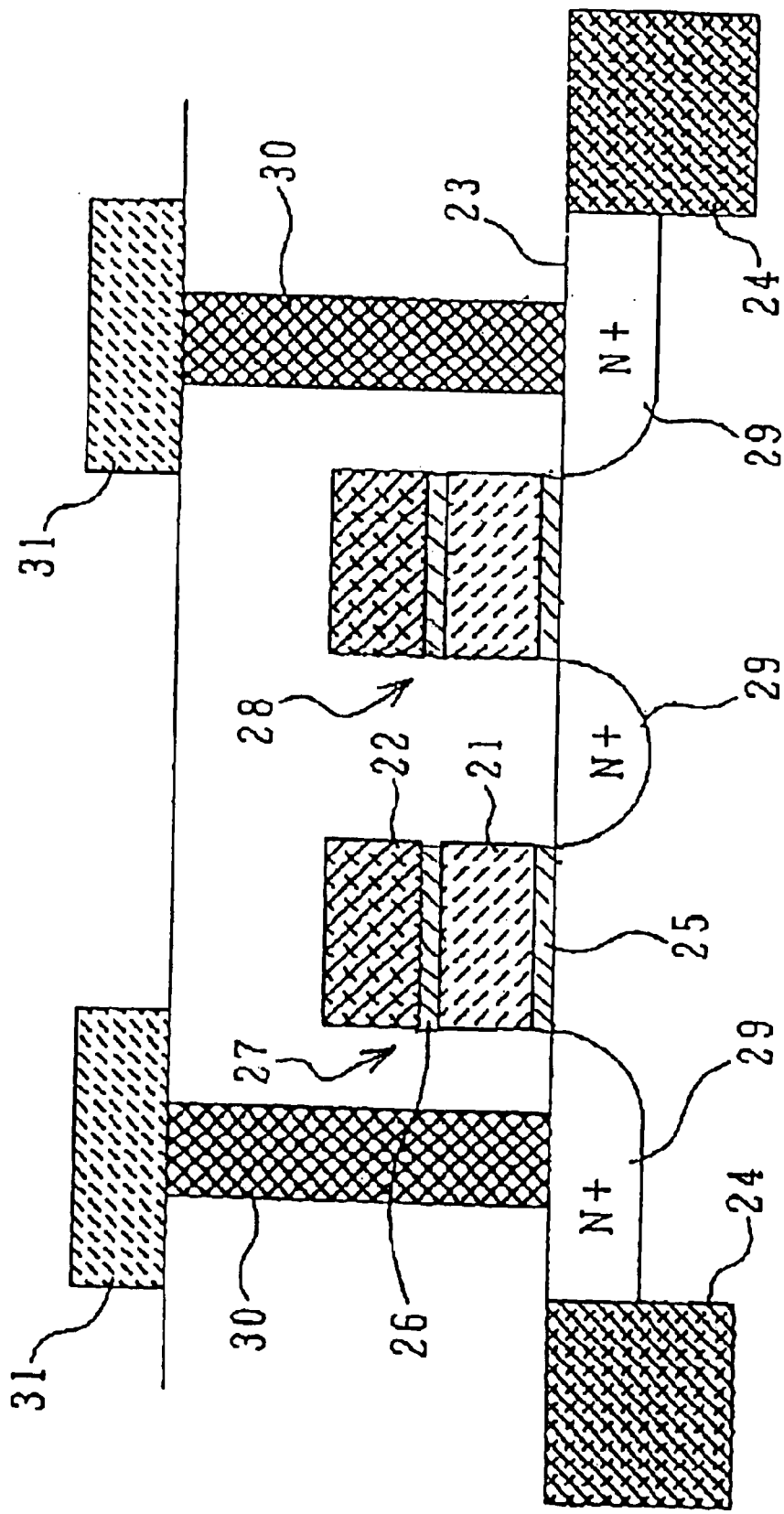
FIG. 1 is a section view of a prior art of a semiconductor device.
Figure 2:
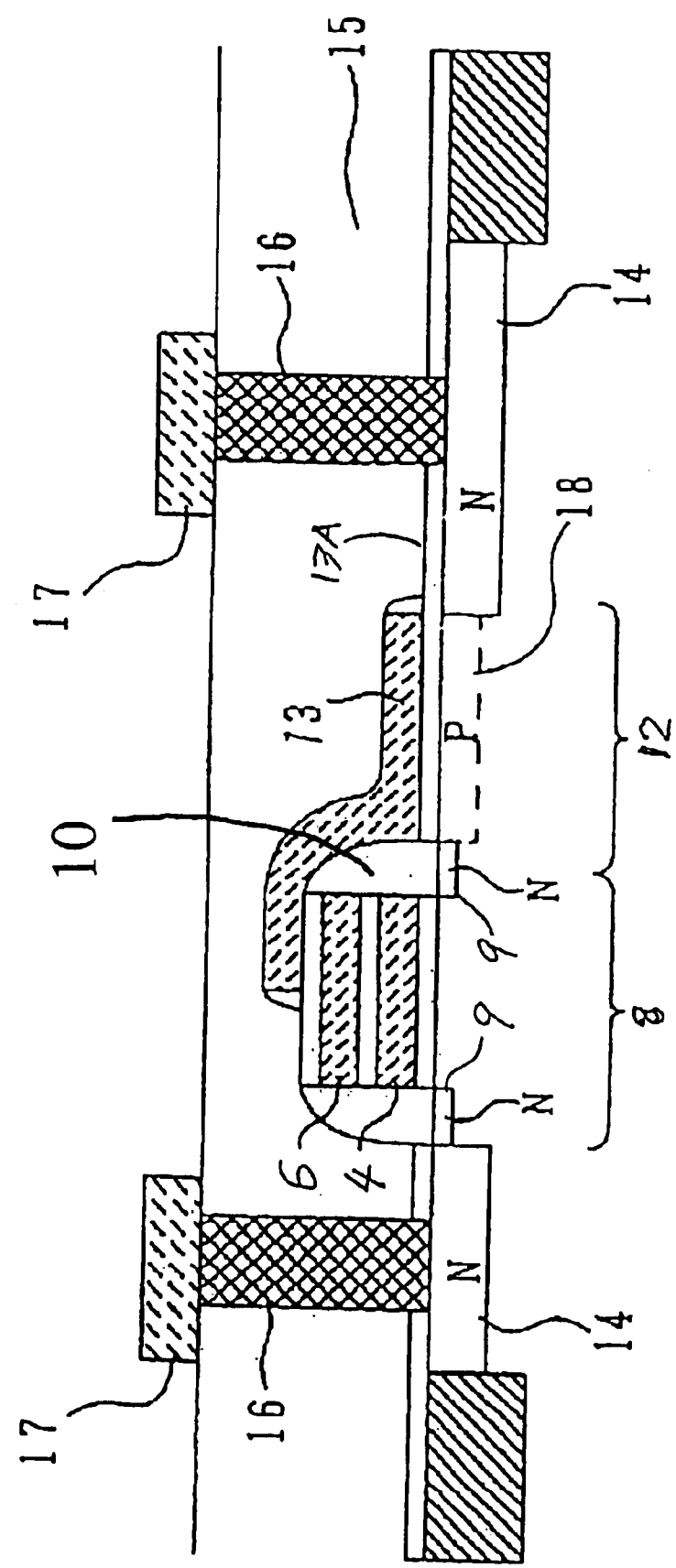
FIG. 2 is a section view showing a step in a method of manufacturing a semiconductor device according to the present invention.

FIG. 2 is a vertical section view showing an embodiment of a semiconductor device according to the present invention.

The semiconductor device in FIG. 2 comprises memory cell transistor 8 including floating gate (hereinafter referred to as FG) 4 and control gate (hereinafter referred to as CG) 6.

Side walls 10 are formed on the sides of gates 4 and 6 of memory cell transistor 8, and N-type diffusion layer area 9 is formed below side walls 10. Diffusion layer area 9 forms part of memory cell transistor 8 and select transistor 12.

N-type second diffusion area 14 is formed in an area different from N-type diffusion layer area 9, and gate 13 of select transistor 12 is provided above channel area 18 between N-type first diffusion area 9 and N-type second diffusion area 14.

Embodiment of Manufacturing Method

FIG. 3 to FIG. 8 are section views showing steps in an embodiment of a method of manufacturing a semiconductor device according to the present invention.

The method of manufacturing a semiconductor device is as follows.

Figure 3:
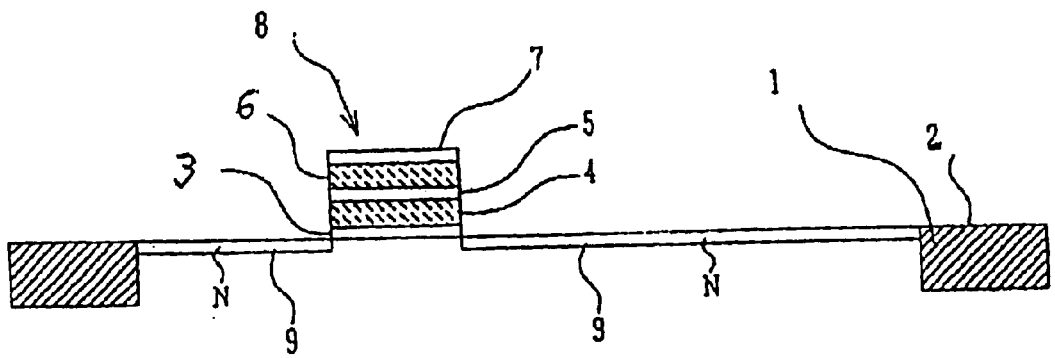
FIG. 3 is a section view showing a step following the step in FIG. 2.

At a first step, FG 4 and CG 6 of memory cell transistor 8 are formed (see FIG. 3).

At a second step, ion implantation is performed in self-alignment with gates 4 and 6 of memory cell transistor 8 formed at the first step used as masks to form N-type first diffusion layer area 9 (see FIG. 3).

Figure 4:
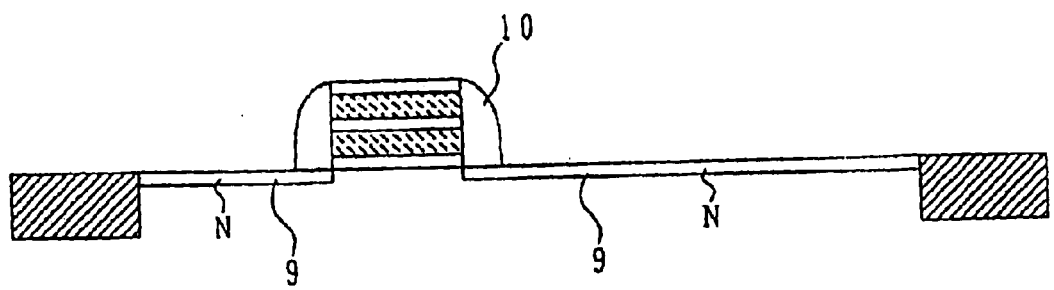
FIG. 4 is a section view showing a step following the step in FIG. 3.

At a third step, side walls 10 are formed on the sides of FG 4 and CG 6 of memory cell transistor 8 (see FIG. 4).

Figure 5:
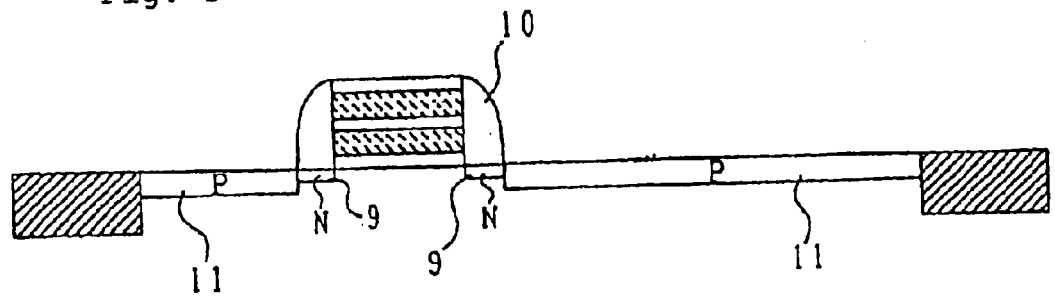
FIG. 5 is a section view showing a step following the step in FIG. 4.
Figure 6:
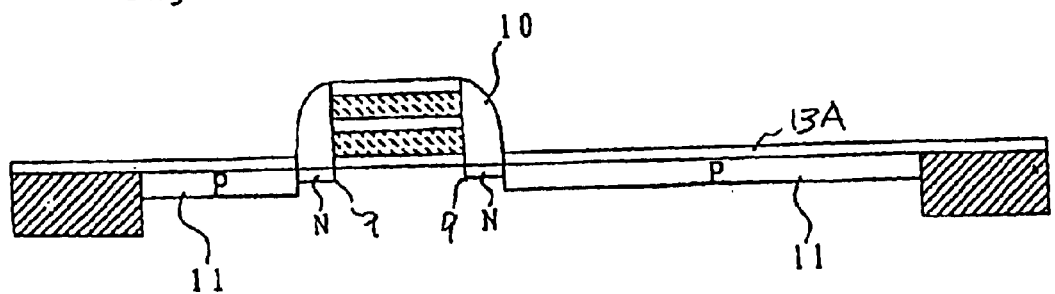
FIG. 6 is a section view showing a step following the step in FIG. 5.

At a fourth step, P-type diffusion layer area 11 is formed with gates 4 and 5 of memory cell transistor 8 and side wall 10 used as masks (see FIG. 5).

Figure 7:
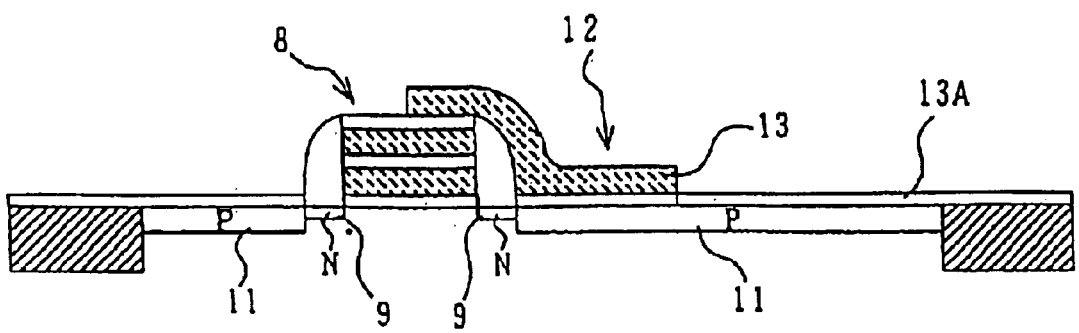
FIG. 7 is a section view showing a step following the step in FIG. 6.

At a fifth step, gate oxide film 13A is formed (see FIG. 6), and gate 13 of select transistor 12 is formed on gate oxide film 13A (see FIG. 7).

Figure 8:
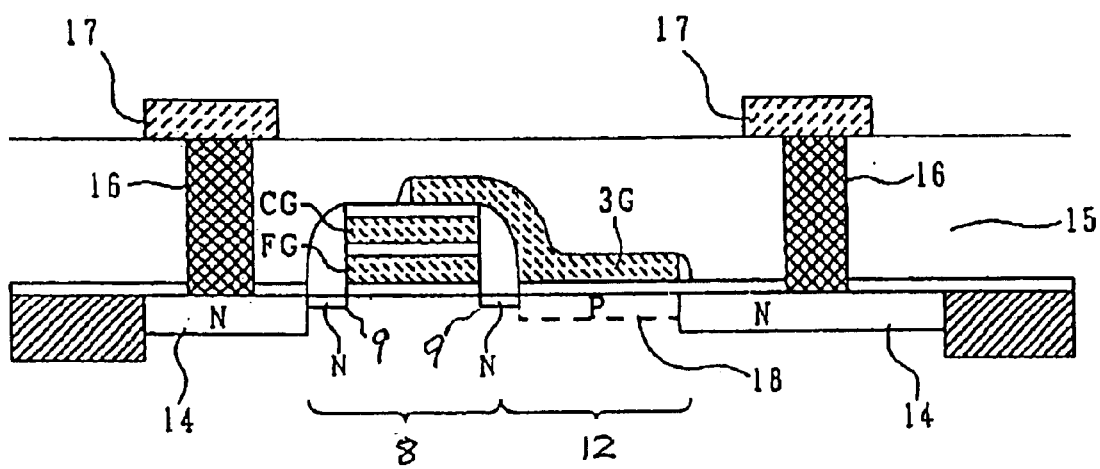
FIG. 8 is a section view showing a step following the step in FIG. 7.

At a sixth step, N-type second diffusion layer area 14 is formed with gates 4 and 6 of memory cell transistor 8, side walls 10, and gate 13 of select transistor 12 used as masks (see FIG. 8).

Next, the method of manufacturing a semiconductor device is described in more detail.

First, element isolation area 1 is formed. Then, tunnel gate oxide film 3, FG 4, ONO film 5, CG 6, and TOP oxide film 7 are formed on silicon substrate 2, and the gate section of memory cell transistor 8 is formed through the lithography technique (see FIG. 3).

Next, phosphorus is ion implanted in self-alignment to the gate section of memory cell transistor 8 to form N-type diffusion layer area 9 (see FIG. 3).

After an oxide film is deposited on the entire surface, side walls 10 are formed on memory cell transistor 8 using an etch back technique for the oxide film or the like (see FIG. 4).

In addition, boron or the like is ion implanted in self-alignment to side walls 10 to compensate N-type diffusion layer area 9, thereby forming P-type diffusion layer area 11. P-type diffusion layer area 11 will serve as a channel area of select transistor 12 (see FIG. 5).

Next, select gate 13 of select transistor 12 is formed through the lithography technique such that it overlaps memory cell transistor 8 (see FIG. 7). After N-type diffusion layer area 14 serving as a source and a drain are formed, interlayer insulating film 15 is formed, and contact 16 and wiring 17 are formed (see FIG. 8).

In the semiconductor device configured in this manner, when electrons are injected into FG 4 of memory cell transistor 8, a voltage of 0 V is applied to the drain, the source, the substrate, and the gate of select transistor 12, and a voltage of 20 V is applied to CG 6. An electric field from CG 6 causes electrons to be injected into FG 4 of memory cell transistor 8 through tunnel gate oxide film 3 from the substrate with an FN current.

When electrons are removed from FG 4 of memory cell transistor 8, applied voltages are the same as those when electrons are injected except for a voltage applied to CG 6, and a voltage of –20V may be applied to CG 6. This causes electrons in CG 6 to pass through tunnel gate oxide film 3 to the substrate with an FN current.

When data is read, a voltage of 5V is applied to the drain, 0V to the source, 0V to the substrate, 0V to CG 6, and 5V to the select gate. At this point, if electrons are removed from FG 4, that is, if FG 4 is positively charged, then memory cell transistor 8 is ON and a current passes between the drain and the source. This can be detected to see that the cell is in "1" state, for example. If electrons are injected into FG 4, memory cell transistor 8 is OFF and no current passes between the drain and the source, thereby making it possible to determine that the cell is in "0" state.

While the aforementioned embodiment provides a description when the P-type silicon substrate is used, a similar structure and a similar manufacturing method can also be realized with an N-type substrate. In this case, of course, the conductive types of the respective diffusion layers must be interchanged.

Since the semiconductor device and the manufacturing method thereof according to the present invention are configured as described above, it is possible to reduce the area of a memory cell.

In addition, the formation of the N-type diffusion layer below the side wall of the memory cell transistor reduces the length of the N-type diffusion layer between the memory cell transistor and the select transistor to result in a lower resistance and thus a larger current passing between the drain and the source at reading. Thus, favorable effects are produced, such as easier detection in determination of "0" or "1" of a cell.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device comprising:
   a memory cell transistor including a floating gate and a control gate;
   a select transistor including a gate electrode;
   side walls formed on the sides of said gates of said memory cell transistor;
   a diffusion layer area formed below said side wall and forming part of said memory cell transistor and said select transistor; and
   a channel area formed below said gate electrode and not below said floating gate, said channel area having a conductivity type opposite to a conductivity type of said diffusion layer;
   wherein said gate electrode of said select transistor extends over a portion of said sidewall and only a portion of said memory cell transistor.

2. A semiconductor device comprising:
   a memory cell transistor including a floating gate and a control gate;
   a select transistor including a gate electrode;
   a side wall formed on the sides of said gates of said memory cell transistor;
   a first diffusion layer area of a first conductive type and having a first resistivity formed below said side wall;

a second diffusion layer area of said first conductive type and having a second resistivity formed having an area different from said first diffusion layer area of said first conductive, type and not substantially extending below said side wall or below said select transistor gate electrode; and said gate of said select transistor provided above a channel area having a second conductive type between said first diffusion layer area of said first conductive type and said second diffusion layer area of said first conductive type, and said gate provided above a portion of said sidewall and a portion of said gate of said memory cell transistor.

3. A semiconductor device comprising:

a semiconductor substrate having a first conductivity type and a first resistivity, and including a first plurality of electrically active regions, each surrounded on a primary surface by an isolation dielectric, each of the first plurality of electrically active regions including at least one memory cell transistor disposed away from the isolation dielectric on two sides and comprising a floating gate, a control gate and a sidewall dielectric, and at least one select transistor disposed away from the isolation dielectric on two sides and comprising a gate electrode disposed not directly contacting the floating gate and the control gate, and at least partly extending over portions of the memory cell transistor and portions of the sidewall dielectric;

a region of the semiconductor substrate disposed between the isolation dielectric and a first side of the memory cell transistor opposite to a side disposed under the select transistor gate and a region of the semiconductor substrate disposed between the isolation dielectric and a first side of the select transistor opposite to a side extending over the memory cell transistor having a second conductivity type and a second resistivity; and a region of the semiconductor substrate disposed primarily below the sidewall dielectric having the second conductivity type and a third resistivity that is higher than the second resistivity.

* * * * *